United States Patent
Chae et al.

(10) Patent No.: US 8,410,822 B2
(45) Date of Patent: Apr. 2, 2013

(54) COMPARATOR-BASED BUFFER WITH RESISTIVE ERROR CORRECTION

(75) Inventors: Jeongseok Chae, Carlsbad, CA (US); Gábor C Temes, Corvallis, OR (US)

(73) Assignee: Asahi Kasei Microdevices Corporation, Tokyo (JP)

( * ) Notice: Subject to any disclaimer, the term of this patent is extended or adjusted under 35 U.S.C. 154(b) by 119 days.

(21) Appl. No.: 13/179,761

(22) Filed: Jul. 11, 2011

(65) Prior Publication Data

US 2012/0007644 A1 Jan. 12, 2012

Related U.S. Application Data

(60) Provisional application No. 61/362,895, filed on Jul. 9, 2010.

(51) Int. Cl.
*G11C 27/02* (2006.01)
(52) U.S. Cl. .............. 327/91; 327/94; 327/337
(58) Field of Classification Search .......... 327/91, 327/94, 337
See application file for complete search history.

(56) References Cited

U.S. PATENT DOCUMENTS

| | | | |
|---|---|---|---|
| 4,987,323 A * | 1/1991 | Fujita | 327/58 |
| 7,218,154 B1 * | 5/2007 | Pantuček et al. | 327/94 |
| 7,319,425 B2 | 1/2008 | Fiorenza et al. | |

OTHER PUBLICATIONS

Chae, J. et al., "A 63 dB 16 mW 20 MHz BW Double-Sampled ΔΣ Analog-to-Digital Converter with an Embedded-Adder Quantizer", IEEE, 2010, 4 pgs.

Schinkel, D. et al., "A Double-Tail Latch-Type Voltage Sense Amplifier with 18ps Setup+Hold Time", IEEE International Solid-State Circuits Conference, 2007, 3 pgs.
Schinkel, D. et al., "A Low-Offset Double-Tail Latch-Type Voltage Sense Amplifier", ProRISC 2007, 18th Annual Workshop on Circuits, Systems and Signal Processing, Nov. 29-30, 2007, 6 pages, Veldhoven, the Netherlands.
Silva, J. et al., "Wideband Low-Distortion Delta-Sigma ADC Topology", Electronic Letters, Jun. 7, 2001, pp. 737-738, vol. 37, No. 12.
Vleugels, K. et al. "A 2.5-V Sigma-Delta Modulator for Broadband Communications Applications", IEEE J. Solid-State Circuits, 2001, pp. 1887-1899, vol. 36, No. 12.
Zhang, Z. et al., "A Segmented Data-Weighted-Averaging Technique", IEEE Int. Symposium Circuits and Systems, May 2007, pp. 481-484, New Orleans.
Lee, K. et al., "A Noise-Coupled Time-Interleaved Delta-Sigma ADC with 4.2 MHz Bandwidth", -98 dB THD, and 79 dB SNDR, JSSC, Dec. 2008, pp. 2601-2612, vol. 43, No. 12.
Yazicioglu, Refet Firat et al., "A 60 μW 60 nV/√Hz Readout Front-End for Portable Biopotential Acquisition Systems", IEEE Journal of Solid-State Circuits, May 2007, pp. 1100-1110, vol. 42, No. 5.
Shin, Soon-Kyun et al., "A Fully-Differential Zero-Crossing-Based 1.2V 10b 26MS/s Pipelined ADC in 65nm CMOS", Symposium on VLSI Circuits Digest of Technical Papers, 2008, pp. 218-219.

(Continued)

*Primary Examiner* — Kenneth B. Wells
(74) *Attorney, Agent, or Firm* — Maine Cemota & Rardin

(57) ABSTRACT

A comparator-based buffer method and system enhance the driving capability of high-gain amplifiers with switched-capacitor loads. It includes a current source, a comparator, switches, sampling capacitor and overshoot correction resistor. A correction solution using a resistor in the charging path and a correction phase reduces the overshoot of the output voltage while constraining power consumption and minimizing components. Spectre® simulations verify the effectiveness of the invention.

20 Claims, 6 Drawing Sheets

COMPARATOR-BASED BUFFER CIRCUIT

OTHER PUBLICATIONS

Fiorenza et al., "Comparator-Based Switched-Capacitor Circuits for Scaled CMOS Technologies", IEEE Journal of Solid-State Circuits, Dec. 2006, pp. 2658-2668, vol. 41, No. 12.

Yazicioglu, Refet Firat et al., "Integrated Low-Power 24-Channel EEG Front End", Electronic Letters, Apr. 14, 2005, 2 pgs., vol. 41, No. 8.

Chae, Jeongseok et al., "Wide Range Single-Way-Pumping Synchronous Mirror Delay", Electronics Letters, May 25, 2000, pp. 939-940, vol. 36, No. 11.

Lee, K. et al, "Noise-Coupled $\Delta\Sigma$ ADCs", Electronics Letters, Nov. 23, 2006, 2 pgs., vol. 42, No. 24.

* cited by examiner

PRIOR ART COMPARATOR-BASED SWITCHED-CAPACITOR (CBSC) CIRCUIT

COMPARATOR-BASED BUFFER CIRCUIT

COARSE AND FINE VOLTAGES FOR CHARGE TRANSFER PHASES

CIRCUIT SIMULATION RESULTS

COMPARATOR-BASED BUFFER WITH RESISTIVE ERROR CORRECTION

RELATED APPLICATIONS

This application claims the benefit of U.S. Provisional Application No. 61/362,895, filed Jul. 9, 2010. This application is herein incorporated by reference in its entirety for all purposes.

FIELD OF THE INVENTION

The invention relates to a comparator-based buffer with a dual overshoot correction to improve the performance of high-gain amplifiers which drive a switched-capacitor load.

BACKGROUND OF THE INVENTION

Universally, there are product demands for electronics miniaturization, reduced power consumption, and higher performance. These demands increase the need for smaller, more efficient circuits for digital to analog and analog to digital converters. Particularly, this includes high performance, high gain amplifiers. Biomedical applications are one, nonlimiting, example.

High-gain amplifiers have difficulties driving large capacitor loads. They need increased bandwidth, higher slew rate, and hence larger power consumption. While there are established ways of dealing with this problem, they present disadvantages. Multiple gain stages may be used to relax the bandwidth requirement. Alternatively, buffer amplifiers can be inserted to decrease the capacitive loading of the main amplifier.

However, both methods increase the power consumption of the system. FIG. 1 displays a conventional comparator-based switched-capacitor (CBSC) circuit 100 to replace amplifiers requiring large static currents with comparators employing small static currents. It includes comparator 105, current sources 110 and 115, switches 120 and 125, and capacitor 130. However, this architecture suffers from overshoot error, caused by comparator delay. To correct this error, an additional "fine" phase is required. During this phase, a low current source is used to correct the error caused by the delay. This requires additional circuitry.

What is needed are techniques for driving large capacitor loads with high gain amplifiers that have low power consumption and simplified circuitry.

SUMMARY OF THE INVENTION

The present invention provides an alternative approach for connecting high-gain amplifiers to sampling capacitors. Embodiments use simplified error correction techniques including a comparator-based buffer and resistor-based overshoot correction.

Embodiments include a buffer comprising an input terminal; an output terminal; a comparator comprising a first positive terminal, wherein the first positive terminal is connected to the input terminal; a resistor in a charging path which is between a second negative terminal of the comparator and the output terminal; a current source which supplies a current to the resister; a first switch which is connectable between the second negative terminal and the output terminal through the resister, wherein the first switch is controlled by the comparator; a second switch which is connectable between the input terminal and the output terminal, wherein the second switch in a reversed phase of the first switch is controlled by the comparator; and a third switch which resets a voltage of the first negative terminal. In another embodiment, the third switch is connectable between the second negative terminal and a desired voltage. For a further embodiment, the current source is forced to supply the current from a power supply to the resister; wherein the desired voltage is one of a ground voltage or a lower voltage than minimum value of the input terminal. In yet another embodiment, the current source is sinked to supply the current from the resister to ground; and wherein the desired voltage is a power supply voltage, or an upper voltage greater than maximum value of the input terminal. A yet further embodiment comprises at least a first phase, a second phase, and a third phase; wherein the third switch (SW3) is turned on to reset a voltage of the first negative terminal in the first phase (φS=H, φ1=H, φ2=L, beginning of coarse phase), and the comparator turns on the first switch and turns off the second switch; wherein the third switch (SW3) is turned off in the second phase (φS=L, φ1=H, φ2=L, post beginning of coarse phase); wherein the comparator turns off the first switch and turns on the second switch in the third phase (φS=L, φ1=H, φ2=L, fine phase). A subsequent embodiment further comprises a high gain amplifier connected to the buffer whereby a high gain buffer is formed. Other embodiments further comprise an analog to digital converter (ADC) connected to the high gain buffer; wherein the analog to digital converter comprises a switched capacitor circuit in a first stage.

Another embodiment includes a comparator-based buffer comprising at least a comparator; a current source; a switch (SW1, SW2) for cancelling overshoot value of time delay of the comparator; and a resistor in a charging path, wherein the resistor generates a constant difference (VCR=RC*IS) between a negative terminal of the comparator and an output terminal of the comparator, for compensating the overshoot. An additional embodiment comprises a reset phase (φS=H, φ1=H, φ2=L, beginning of coarse phase); a coarse settling phase (φS=L, φ1=H, φ2=L, post beginning of coarse phase); and a fine settling phase (φS=L, φ1=L, φ2=H, fine phase).

Yet another embodiment includes a system for high gain amplifiers to drive a switched capacitor load comprising a buffer section comprising a high gain amplifier input; a current source; a comparator; at least a first switch, a second switch, and a resistor in a charging path; and an analog to digital converter (ADC) section comprising a sampling capacitor; wherein in a second phase (φ2) rises, the sampling capacitor is discharged and reset to ground when a first phase rises and a third phase rises, voltage $V_A$ resets, and output of the comparator turns on the first switch connected to the current source, when the third phase falls, the sampling capacitor charges to input voltage $V_{in}$, when the voltage $V_A$ exceeds the input voltage $V_{in}$, the first switch opens and output of the high gain amplifier is connected directly to input of the sampling capacitor of the ADC through the second switch, reducing overshoot error, and when the second phase rises, charge on the sampling capacitor is delivered to the ground and an amplifier of the ADC.

A further embodiment includes a method for high gain amplifiers to drive a switched capacitor load, the method comprising the steps of discharging at least one sampling capacitor when a second phase Φ2 rises; resetting voltage $V_A$, and turning on at least a first switch by a comparator output when a first phase Φ1 and a third phase ΦS rise; charging the sampling capacitor to $V_{in}$ when the third phase ΦS falls; opening the first switch when the voltage $V_A$ exceeds the $V_{in}$; and delivering charge of the at least one sampling capacitor to virtual ground and an amplifier of an analog to digital converter (ADC) section when the second phase Φ2 rises. In another embodiment, the voltage $V_{in}$ is input voltage to the high gain amplifier. For a further embodiment, the voltage $V_A$ is a voltage at a negative input to the comparator. In yet another embodiment, the first phase Φ1 is an input sampling clock phase for the at least one sampling capacitor. For other embodiments, the second phase Φ2 is a holding clock phase for the at least one sampling capacitor. In a subsequent embodiment, the third phase ΦS is a short pulse. In an additional embodiment, the short pulse third phase ΦS is synchronized with the first phase Φ1. For further embodiments, the step of charging comprises opening at least a third switch between a node of the voltage $V_A$ and a ground. Other embodiments provide that the step of opening the first switch comprises connecting output of amplifier directly to the sampling capacitor through a second switch whereby overshoot error is reduced. A yet further embodiment provides that the at least a first switch is connected between a current source and resistor and a voltage $V_B$ node.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The following detailed description provides example embodiments of the presently claimed invention with references to the accompanying drawings. The description is intended to be illustrative and not limiting the scope of the present invention. Embodiments are described in sufficient detail to enable one of ordinary skill in the art to practice the subject invention. Other embodiments may be practiced with some variations without departing from the spirit or scope of the subject invention. Drawings are not necessarily to scale; the emphasis is to illustrate the principles of the invention.

A comparator-based buffer with a dual overshoot correction improves the performance of high-gain amplifiers which drive a switched-capacitor load. Effectiveness of the invention is demonstrated by simulations.

Figure 1:
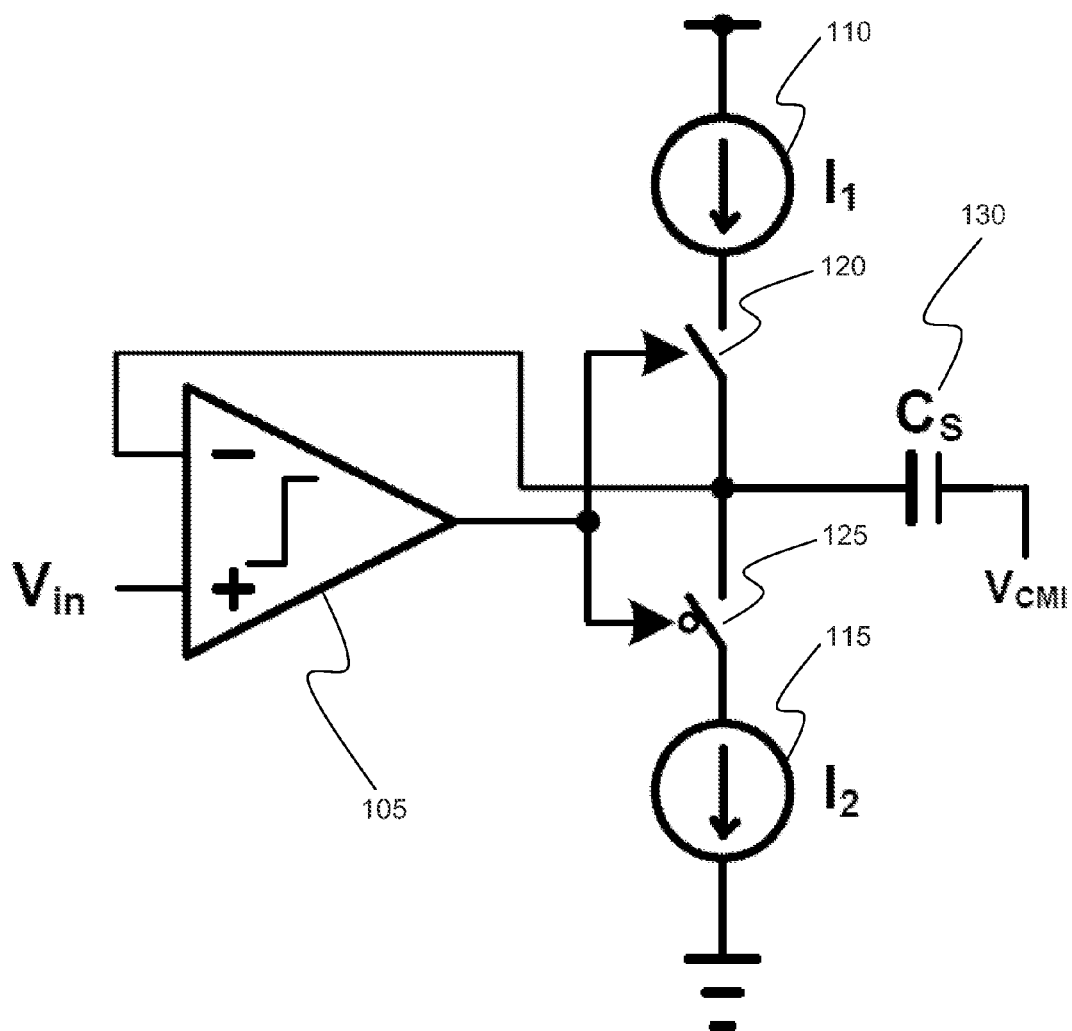
FIG. 1 is a conventional comparator-based switched-capacitor circuit.
Figure 2:
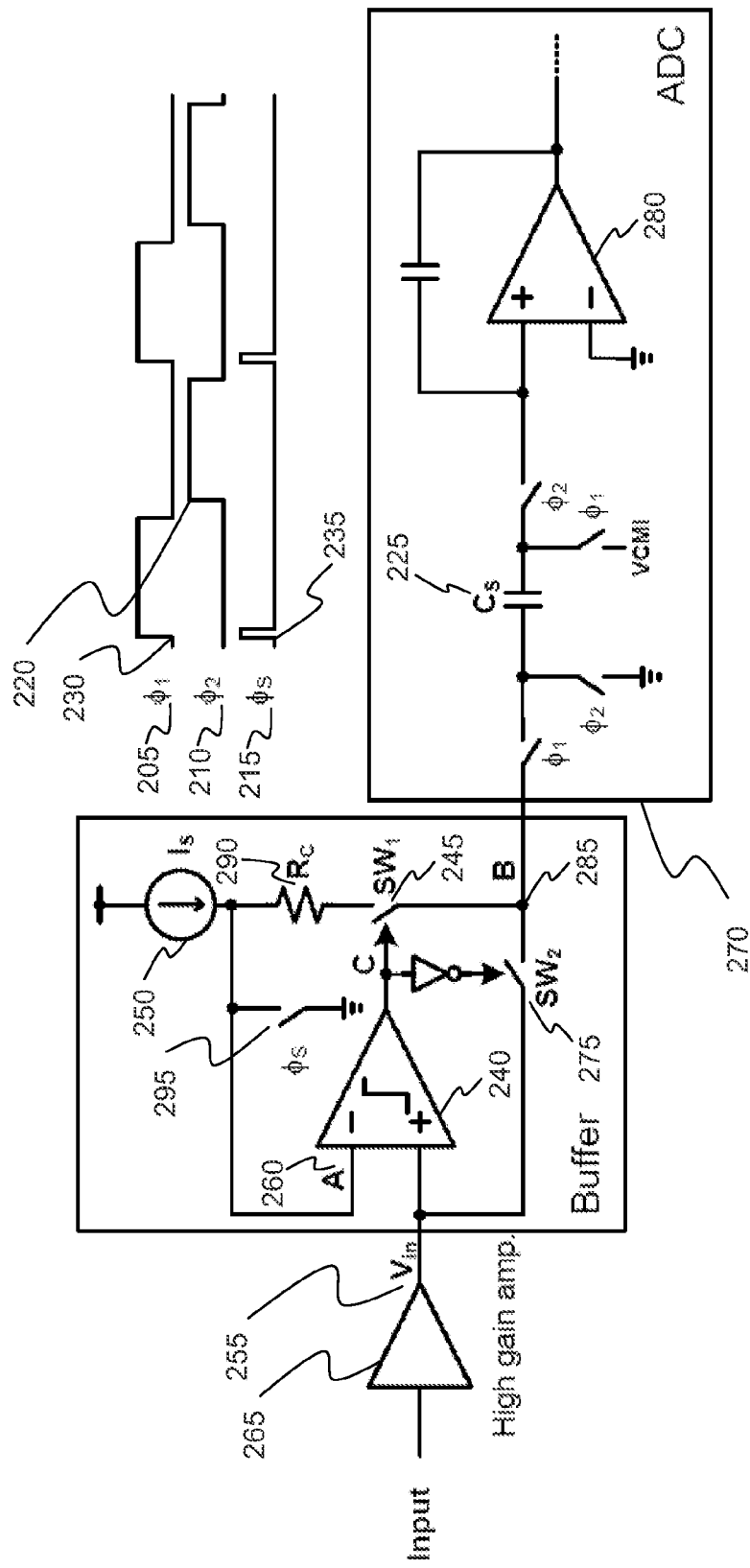
FIG. 2 is a comparator-based buffer configured in accordance with one embodiment of the present invention.

FIG. 2 depicts an embodiment of a comparator-based buffer 200. Its clock uses three phases, Φ1 205, Φ2 210, and ΦS 215. When Φ1 equals 1 230, this is a sampling phase of input sampling capacitor $C_S$ 225 of ADC 270, and sampling capacitor $C_S$ 225 is connected to the node of the voltage $V_B$ AT 285. When Φ2 equals 1 220, this is a holding phase of input sampling capacitor $C_S$ 225 of ADC 270, and sampling capacitor $C_S$ 225 is connected to amplifier 280 of ADC 270. ΦS 215, which comprises a short pulse 235, synchronizes with Φ1 205.

When Φ2 equals 1 220, sampling capacitor $C_S$ 225 is discharged, and reset to ground.

When Φ1 rises 230 and ΦS rises 235, switch $SW_3$ 295 connects to ground, voltage $V_A$ 260 resets in a short time, and comparator 240 output turns on switch $SW_1$ 245 connected to current source 250. At this time, resistor $R_C$ 290 connects between the node of the voltage $V_A$ 260 and the node of the voltage $V_B$ 285.

When ΦS falls, switch $SW_3$ 295 opens and sampling capacitor $C_S$ 225 starts to charge up to input voltage $V_{in}$ 255.

This operation ends when voltage $V_A$ 260 exceeds $V_{in}$ 255, and $SW_1$ 245 opens. At this time, output of amplifier 265 ($V_{in}$ 255) is connected directly to input sampling capacitor $C_S$ 225 of ADC 270 through switch $SW_2$ 275, to reduce the overshoot error.

Finally, when Φ2 210 rises 220, the charge on $C_S$ 225 is delivered into the virtual ground and connected to amplifier 280 of ADC 270.

Current source 250 connects between resistor $R_C$ 290 and a power supply which is forced to supply a current to the resister Rc 290. Switch $SW_3$ 295 connects to ground or a lower voltage than the minimum value of $V_{in}$.

In another embodiment of a comparator-based buffer 200, current source 250 connects between resistor $R_C$ 290 and ground, which is sinked to supply a current from resister $R_C$ 290. Switch $SW_3$ 295 connects to the power supply voltage or an upper voltage greater than the maximum value of $V_{in}$.

Embodiments require only a short time for the fine charge transfer, and hence comparator 240 can be optimized by proper trade-off between time delay and power consumption. In addition, the correction will be accurate, because of the direct connection between amplifier 280 and sampling capacitor 225.

Embodiments comprise a resistor-based overshoot correction solution. To reduce the overshoot of $V_B$ 285, a simplified correction approach is used. As mentioned, for other known approaches an additional reference voltage or switched-capacitor circuitry are used. In these other schemes, the error voltage is modeled by an input offset voltage of the comparator, and partially cancelled by a negative input voltage to decrease the swing requirements in the fine correction phase. In embodiments of the invention, a resistor $R_C$ 290 is placed in the charging path (FIG. 2).

Figure 3:
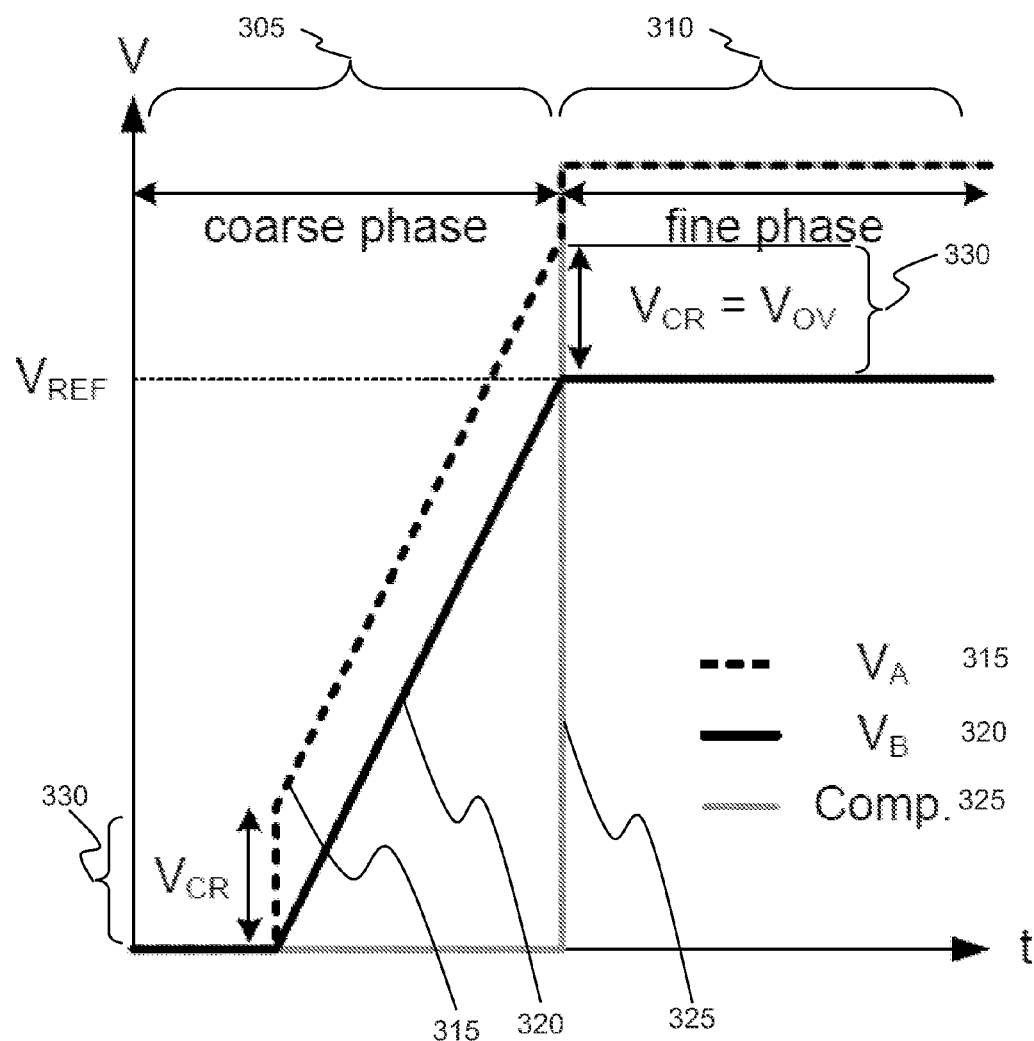
FIG. 3 is a graph depicting coarse and fine charge transfer phases of the output correction system configured in accordance with one embodiment of the present invention.

FIG. 3 is a graph 300 depicting the resulting voltages for coarse 305 and fine 310 charge transfer phases of the output correction system. It presents values for $V_A$ 315, $V_B$ 320, and Comp. 325. Due to $R_C$ (FIG. 2, 290), there is a constant difference $V_{CR}$ 330 between $V_A$ 315 and $V_B$ 320 during the coarse phase. $V_{CR}=R_C \cdot I_S$ and compensates for the overshoot caused by the comparator delay.

By choosing $R_C=t_d/C_S$, where $t_d$ is the time delay of comparator (FIG. 2, 240), the overshoot of $V_B$ 320 can be cancelled. Since $t_d$ can only be estimated from simulations and is signal-dependent, for embodiments the fine correction phase will still be needed, but it can be much shorter than without inserting $R_C$.

Figure 4:
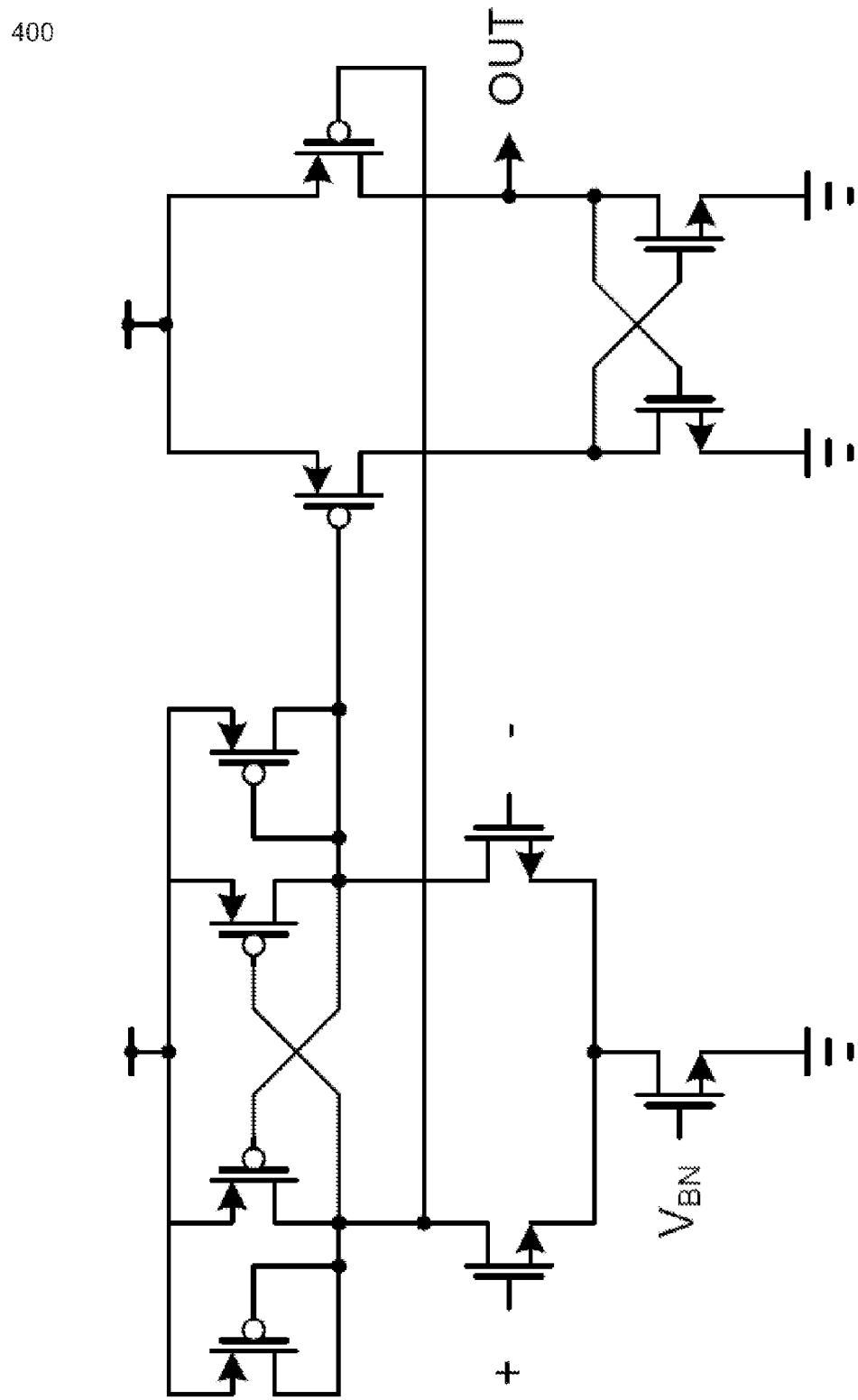
FIG. 4 is a comparator schematic configured in accordance with one embodiment of the present invention.

FIG. 4 provides an embodiment 400 of the comparator circuit used in simulations using the SPICE-class circuit simulator Spectre®. Spectre® is a registered trademark of Cadence Design Systems, Inc. Corporation, Delaware.

Figure 5:
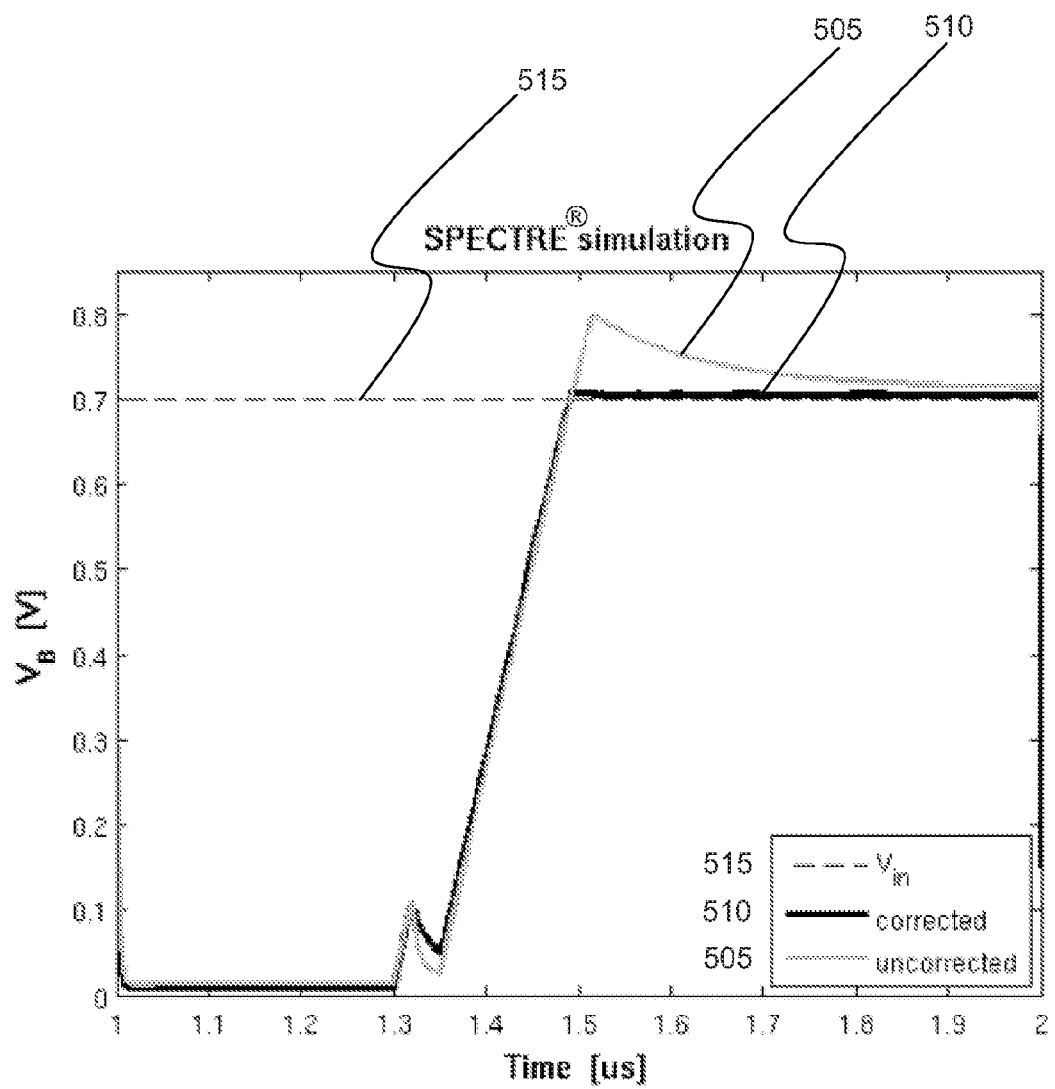
FIG. 5 is a graph depicting transient simulation results configured in accordance with one embodiment of the present invention.

FIG. 5 is a graph 500 depicting transient simulation results for an embodiment. The circuit of FIG. 2 was simulated using Spectre®. Selected values comprise $C_S=3$ pF, a settling time of 330 ns, and $I_S$=9 pA. The comparator shown in FIG. 4 was used. Simulations indicated an average delay $t_d$=2.17 ns for this stage. Since the on-resistance of switch $SW_1$ (FIG. 2, 245) is 1.4 kΩ, $R_C$=5.5 kΩ was chosen. The output impedance of the high-gain amplifier was assumed to be 40 kΩ. VDD was 1.2 V. The graph shows the simulated transient of $V_B$ without correction 505 and with the correction 510 provided by $R_C$. After the coarse phase, the corrected output is very close to $V_{in}$ 515, and the amplifier only needs to provide a small voltage change during the fine correction phase. However, for the uncorrected scheme, the fine phase is not long enough to correct for the overshoot voltage.

Figure 6:
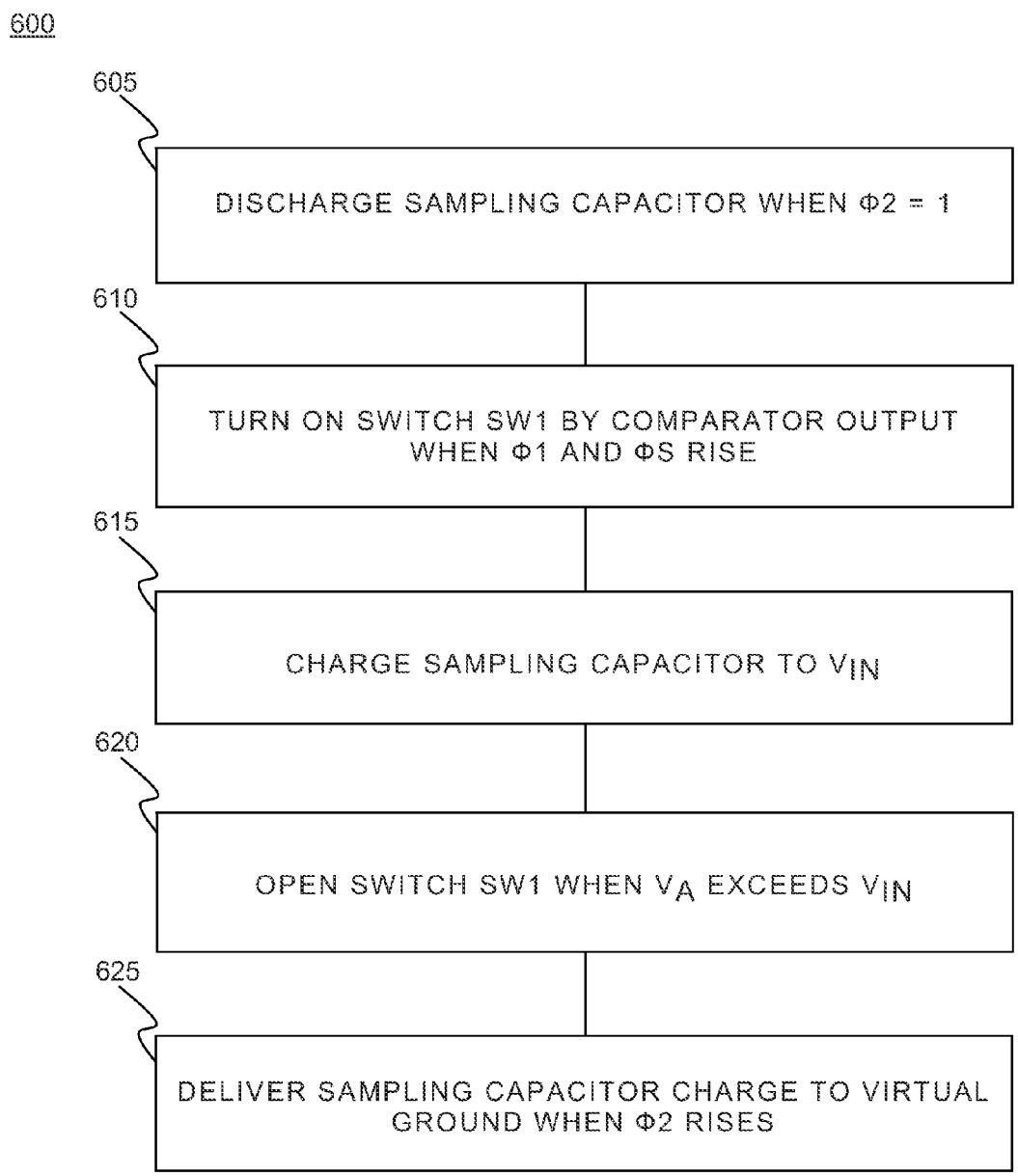
FIG. 6 is a flow chart of a method for high gain amplifiers to drive a switched capacitor load configured in accordance with one embodiment of the present invention.

FIG. 6 is a flow chart 600 of an embodiment of the method for high gain amplifiers to drive a switched capacitor load. Steps comprise discharging sampling capacitor $C_S$ when $\Phi 2$=1 605; turning on switch $SW_1$ by comparator output when $\Phi 1$ and $\Phi S$ rise 610; charging sampling capacitor $C_S$ to $V_{IN}$ 615; opening switch $SW_1$ when $V_A$ exceeds $V_{IN}$ 620; and delivering sampling capacitor charge to virtual ground when $\Phi 2$ rises 625.

Table 1 summarizes simulation results with various input voltages for the corrected and the uncorrected outputs. They are found at the end of the fine phase. The error of the corrected circuit is much smaller than that of the uncorrected one.

TABLE 1

| $V_{in}$ [V] | Error voltage [mV] | |
|---|---|---|
| | corrected | uncorrected |
| 0.4 | 15.7 | 39.7 |
| 0.5 | 12.3 | 33.4 |
| 0.6 | 8.4 | 28.5 |
| 0.7 | 5.2 | 24.1 |
| 0.8 | 2.4 | 20.3 |

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A buffer comprising:
an input terminal;
an output terminal;
a comparator comprising a first, positive, terminal, wherein said first positive terminal is connected to said input terminal;
a resistor in a charging path which is between a second negative terminal of said comparator and said output terminal;
a current source which supplies a current to said resistor;
a first switch which is connectable between said second, negative, terminal and said output terminal through said resistor, wherein said first switch is controlled by said comparator;
a second switch which is connectable between said input terminal and said output terminal, wherein said second switch in a reversed phase of said first switch is controlled by said comparator; and
a third switch which resets a voltage of said first negative terminal.

2. The buffer of claim 1; wherein said third switch is connectable between said second negative terminal and a desired voltage.

3. The buffer of claim 2; wherein said current source is forced to supply said current from a power supply to said resistor; and
wherein said desired voltage is one of a ground voltage or a lower voltage than minimum value of said input terminal.

4. The buffer of claim 2; wherein said current source is sinked to supply said current from said resister to ground; and
wherein said desired voltage is a power supply voltage, or an upper voltage greater than maximum value of said input terminal.

5. The buffer of claim 1 comprising at least a first phase, a second phase, and a third phase;
wherein said third switch is turned on to reset a voltage of said first negative terminal in said first phase, and said comparator turns on said first switch and turns off said second switch;
wherein said third switch is turned off in said second phase;
wherein said comparator turns off said first switch and turns on said second switch in said third phase.

6. The buffer of claim 1 further comprising:
a high gain amplifier connected to said buffer whereby a high gain buffer is formed.

7. The high gain buffer of claim 6 further comprising:
an analog to digital converter (ADC) connected to said high gain buffer; wherein said analog to digital converter comprises a switched capacitor circuit in a first stage.

8. A comparator-based buffer comprising:
at least a comparator;
a current source;
a switch for cancelling overshoot value of time delay of said comparator; and
a resistor in a charging path, wherein said resistor generates a constant difference between a negative terminal of said comparator and an output terminal of said comparator, for compensating said overshoot.

9. The comparator-based buffer of claim 8, comprising:
a reset phase;
a coarse settling phase; and
a fine settling phase.

10. A system for high gain amplifiers to drive a switched capacitor load comprising:
a buffer section comprising:
a high gain amplifier input;
a current source;
a comparator;
at least a first switch, a second switch, and a resistor in a charging path; and
an analog to digital converter (ADC) section comprising:
a sampling capacitor;
wherein when a second phase rises, said sampling capacitor is discharged and reset to ground when a first phase rises and a third phase rises, voltage $V_A$ resets, and output of said comparator turns on said first switch connected to said current source,
when said third phase falls, said sampling capacitor charges to input voltage $V_{in}$,
when said voltage $V_A$ exceeds said input voltage $V_{in}$, said first switch opens and output of said high gain amplifier is connected directly to input of said sampling capacitor of said ADC through said second switch, reducing overshoot error, and when said second phase rises, charge on said sampling capacitor is delivered to said ground and an amplifier of said ADC.

11. A method for use with a high gain amplifier to drive a switched capacitor load, said method comprising the steps of:
  discharging at least one sampling capacitor when a second phase Φ2 rises;
  resetting voltage $V_A$, and turning on at least a first switch by a comparator output when a first phase Φ1 and a third phase ΦS rise;
  charging said sampling capacitor to voltage $V_{in}$ when said third phase ΦS falls;
  opening said first switch when said voltage $V_A$ exceeds said voltage to $V_{in}$; and
  delivering charge of said at least one sampling capacitor to virtual ground and an amplifier of an analog to digital converter (ADC) section when said second phase Φ2 rises.

12. The method of claim 11, wherein said voltage $V_{in}$ is input voltage to said high gain amplifier.

13. The method of claim 11, wherein said voltage $V_A$ is voltage at negative input to said comparator.

14. The method of claim 11, wherein said first phase Φ1 is an input sampling clock phase for said at least one sampling capacitor.

15. The method of claim 11, wherein said second phase Φ2 is a holding clock phase for said at least one sampling capacitor.

16. The method of claim 11, wherein said third phase ΦS is a short pulse.

17. The method of claim 16, wherein said short pulse third phase ΦS is synchronized with said first phase Φ1.

18. The method of claim 11, wherein said step of charging comprises opening at least a third switch between a node of said voltage $V_A$ and a ground.

19. The method of claim 11, wherein said step of opening said first switch comprises connecting an output of said high gain amplifier directly to said sampling capacitor through a second switch whereby overshoot error is reduced.

20. The method of claim 11, wherein said at least a first switch is connected between a current source and resistor and a voltage $V_B$ node.

* * * * *